(12) United States Patent
Sukegawa et al.

(10) Patent No.: US 10,418,394 B2
(45) Date of Patent: Sep. 17, 2019

(54) SEMICONDUCTOR DEVICE, SOLID-STATE IMAGING DEVICE, AND CAMERA SYSTEM

(75) Inventors: Shunichi Sukegawa, Ibaraki (JP); Noriyuki Fukushima, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 549 days.

(21) Appl. No.: 13/697,167

(22) PCT Filed: May 26, 2011

(86) PCT No.: PCT/JP2011/002944
§ 371 (c)(1),
(2), (4) Date: Nov. 9, 2012

(87) PCT Pub. No.: WO2011/152003
PCT Pub. Date: Dec. 8, 2011

(65) Prior Publication Data
US 2013/0062504 A1    Mar. 14, 2013

(30) Foreign Application Priority Data
Jun. 2, 2010   (JP) .................................. 2010-127237

(51) Int. Cl.
*H01L 27/146* (2006.01)
*H01L 23/48* (2006.01)
*H01L 23/498* (2006.01)

(52) U.S. Cl.
CPC .... *H01L 27/14618* (2013.01); *H01L 27/1469* (2013.01); *H01L 27/14634* (2013.01);
(Continued)

(58) Field of Classification Search
CPC ......... H01L 27/14683; H01L 27/14618; H01L 27/14634; H01L 27/1469; H01L 23/481;
(Continued)

(56) References Cited

U.S. PATENT DOCUMENTS 5,973,337 A * 10/1999 Knapp .................. H01L 23/293
257/100
6,198,147 B1 * 3/2001 Connolly .......... H01L 27/14647
257/440

(Continued)

FOREIGN PATENT DOCUMENTS

JP    02-177449    7/1990
JP    11-154728    6/1999
(Continued)

OTHER PUBLICATIONS

International Search Report; Application No. PCT/JP2011/002944; Date of completion of internation search: Aug. 3, 2011.
(Continued)

*Primary Examiner* — Evan P Dzierzynski
*Assistant Examiner* — Mitchell T Oestreich
(74) *Attorney, Agent, or Firm* — Chip Law Group

(57) ABSTRACT

Disclosed herein is a solid state imaging device including a support substrate; an imaging semiconductor chip having a pixel array disposed on the support substrate; and an image processing semiconductor chip disposed on the support substrate, wherein the imaging semiconductor chip and the image processing semiconductor chip are connected by through-vias, and interconnects formed on the support substrate.

22 Claims, 14 Drawing Sheets

(52) U.S. Cl.
CPC ...... *H01L 27/14683* (2013.01); *H01L 23/481* (2013.01); *H01L 23/49827* (2013.01); *H01L 2224/13* (2013.01); *H01L 2924/13091* (2013.01)

(58) Field of Classification Search
CPC .......... H01L 23/49827; H01L 2224/13; H01L 2924/13091
USPC ..................................................... 250/208.1
See application file for complete search history.

(56) References Cited

U.S. PATENT DOCUMENTS

| | | | |
|---|---|---|---|
| 6,348,382 B1* | 2/2002 | Su et al. ....................... 438/275 |
| 6,504,196 B1* | 1/2003 | Rhodes ............. H01L 27/14609 257/291 |
| 7,696,465 B2* | 4/2010 | Wu et al. .................... 250/208.1 |
| 2002/0113887 A1* | 8/2002 | Iimura et al. ................. 348/310 |
| 2009/0242950 A1* | 10/2009 | McCarten et al. ............ 257/292 |
| 2009/0278219 A1* | 11/2009 | Morrison .......... H01L 27/14618 257/432 |
| 2009/0321948 A1* | 12/2009 | Wang et al. ................... 257/777 |
| 2010/0079645 A1* | 4/2010 | Rhodes .......................... 348/302 |
| 2010/0140732 A1* | 6/2010 | Eminoglu et al. ............ 257/447 |
| 2010/0320552 A1* | 12/2010 | Tseng et al. ................. 257/432 |
| 2011/0080511 A1* | 4/2011 | Lee et al. ...................... 348/308 |
| 2011/0157395 A1* | 6/2011 | Compton ............... H04N 5/335 348/222.1 |

FOREIGN PATENT DOCUMENTS

| | | |
|---|---|---|
| JP | 2002-271700 | 9/2002 |
| JP | 2004-111572 | 4/2004 |
| JP | 2004-146816 | 5/2004 |
| JP | 2007-013089 | 1/2007 |
| JP | 2007-317741 | 12/2007 |
| JP | 2008-085755 | 4/2008 |

OTHER PUBLICATIONS

PCT Written Opinion of the International Searching Authority; International Application No. PCT/JP2011/002944; Date of completion of Opinion: Aug. 3, 2011.

* cited by examiner

SEMICONDUCTOR DEVICE, SOLID-STATE IMAGING DEVICE, AND CAMERA SYSTEM

BACKGROUND ART

The present disclosure relates to a semiconductor device having a stacking structure of two chips, a solid-state imaging device, and a camera system.

Traditionally, for an imaging device, two chips, a CMOS image sensor (CIS) chip and an image processing chip, are each mounted in a package and assembly is carried out as a module.

Alternatively, each chip is COB (Chip On Board) mounted in some cases.

In recent years, in the case of mounting an imaging device in a cellular phone or the like, reduction in the mounting area and miniaturization are required, and an SOC (System-On-Chip) to integrate the above-described two chips into one chip has been developed.

However, in the process in which the CIS process and the high-speed logic process are mixed for the integration into one chip, not only that the number of steps is increased and the cost is high but also that it is difficult to keep both of the analog characteristics and the logic characteristics favorable, which possibly leads to characteristic deterioration of the imaging device.

So, a method of assembling the above-described two chips at the chip level to achieve both of miniaturization and characteristic enhancement has been proposed (refer to Japanese Patent Laid-open Nos. 2004-146816 and 2008-85755).

SUMMARY OF INVENTION

However, in the connection between two chips, because of its structure, the arrangement pitch is small and furthermore yield lowering is possibly caused.

Moreover, in supply of DC components such as power supply and a reference signal from the logic chip to the CIS chip, it is susceptible to the influence of 1/f noise and so forth. Therefore, there is a disadvantage that a special circuit is necessary for communication with the above-described logic chip and cost increase is caused as a result.

The present disclosure is to provide a semiconductor device, a solid-state imaging device, and a camera system that can reduce the influence of noise due to the connecting part between both chips and require no special circuit for communication and thus can achieve cost reduction as a result, and in addition are capable of enhancing the arrangement density in the connecting part between both chips and suppressing increase in the parasitic resistance and the capacity.

According to an embodiment of the present disclosure, there is provided a solid state imaging device including a support substrate; an imaging semiconductor chip having a pixel array disposed on said support substrate; and an image processing semiconductor chip disposed on said support substrate, wherein said imaging semiconductor chip and said image processing semiconductor chip are connected by through-vias, and interconnects formed on said support substrate.

According to another embodiment of the present disclosure, there is provided A method of making a solid imaging device including forming a layer of interconnects on a support substrate; bonding a plurality of imaging semiconductor chips and a plurality of image processing semiconductor chips to a surface of said support substrate in a tile manner; filling gaps between said plurality of imaging semiconductor chips and said plurality of image processing semiconductor chips with a resin; polishing said plurality of imaging semiconductor chips and said plurality of image processing semiconductor chips; and forming through-vias from a back surface side of said plurality of imaging semiconductor chips and said plurality of image processing semiconductor to said layer of interconnects.

According to the present disclosure, the influence of noise due to the connecting part between both chips can be reduced, and no special circuit is required for communication and thus cost reduction can be achieved as a result.

In addition, according to the present embodiment, the arrangement density in the connecting part between both chips can be enhanced and the increase in the parasitic resistance and the capacitance can be suppressed.

DETAILED DESCRIPTION OF THE PREFERRED EMBODIMENTS

An embodiment of the present disclosure will be described below in association with the drawings.

The description will be made in the following order.

1. Outline of Solid-state Imaging Device
2. Process Flow
3. Circuit Configuration and Arrangement 4. Pad Structure
5. Chip Scale Package (CSP)
6. Bonding of Individual Chips <1. Outline of Solid-State Imaging Device>

Figure 1:
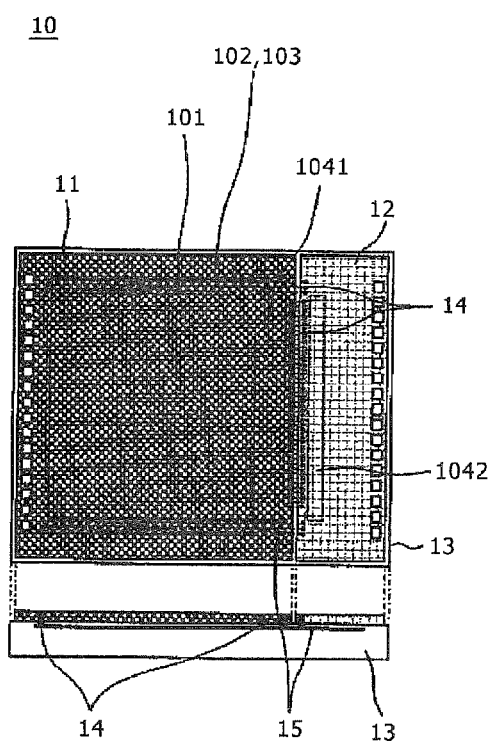
FIG. 1 is a diagram showing a configuration example of a solid-state imaging device as a semiconductor device relating to an embodiment of the present disclosure.

FIG. 1 is a diagram showing a configuration example of a solid-state imaging device as a semiconductor device relating to the embodiment of the present disclosure.

In the present embodiment, the configuration of a CMOS image sensor will be described as one example of the semiconductor device.

As shown in FIG. 1, in a solid-state imaging device 10, a first chip 11 and a second chip 12 are disposed in parallel on e.g. a support substrate (interposer) 13.

This solid-state imaging device 10 is characterized in that, as described later, an interconnect layer is provided on the support substrate 13 used for a CMOS image sensor (CIS: CMOS Image Sensor) to carry out electrical connection between the first chip (CIS chip) and the logic chip bonded on the support substrate.

In the present embodiment, the first chip 11 is formed of a CMOS image sensor (CIS) chip and the second chip 12 is formed of a logic chip including a control circuit for the first chip and an image processing circuit.

The first chip (CIS chip) 11 and the second chip (logic chip) 12 are disposed face down on the support substrate 13 so that the respective circuit surfaces may be in contact with the support substrate (interposer) 13.

Furthermore, signals of the respective chips of the first chip 11 and the second chip 12 are connected by through-vias (VIAs) 14 and interconnects 15 formed on the support substrate 13.

The first chip (CIS chip) 11 is configured with high-breakdown-voltage transistors (CMOS) and uses a process in which the analog characteristics and the noise characteristics, including the pixel characteristics, are sufficiently managed, and the amount of noise is sufficiently small.

Here, the high-breakdown-voltage transistor is a transistor in which the thickness of the gate oxide film as the gate insulating film is set larger than that in a normal MOS-based transistor and that is capable of operating with a high voltage without problems. The thickness of the gate oxide film of the high-breakdown-voltage transistors preferably has a thickness of substantially from 5 nm to 7 nm.

Furthermore, the interconnect layer 15 is configured with the minimum number of interconnect layers necessary for the circuit on which the interconnect layer 15 is mounted, and generally the number of interconnect layers 15 is smaller than that in a CIS-logic (Logic) mixed circuit.

On the first chip (CIS chip) 11 of the present embodiment, a pixel array 101, a vertical decoder 102 as a vertical drive circuit configured with high-breakdown-voltage Tr., a driver 103, and an analog circuit are mounted, as described in detail later.

In particular, mounting of circuits whose characteristics are affected by 1/f noise (pixel transistor, comparator 1041, DAC (Digital Analog converter) circuit, and so forth) on the first chip (CIS chip) 11 is a characteristic of the present embodiment.

On the other hand, circuits other than the circuits mounted on the first chip (CIS chip) 11 are mounted on the second chip (logic chip) 12.

Circuits that can be configured by a low-voltage, high-speed logic process, an IO circuit, etc. correspond to those.

In the second chip (logic chip) 12, a low-voltage, high-speed transistor (LV Tr.) for a logic circuit and a memory circuit and a high-breakdown-voltage transistor (HV Tr.) for an input/output circuit are used.

The low-voltage, high-speed transistor Tr. refers to a transistor that is so formed as to operate at high speed even with a low voltage by setting the film thickness of the gate insulating film equal to or larger than that of a normal MOS-based transistor. The thickness of the gate oxide film of the low voltage transistors preferably has a thickness of substantially from 1.5 nm to 3 nm.

In view of change and development in FAB, it is preferable to employ a circuit configuration that can be designed by using a general ASIC design flow, and it becomes easy to attempt product development by combining logic chips of different functions, characteristics, and process with the same CIS chip.

In general, the amounts of various kinds of noise in the Logic process, such as RTS, heat, and e.g. 1/f noise, are larger than those in the analog process in which the amount of noise is managed.

In the case of attempting to solve problems of the noise and so forth, there is a possibility that not only that cost increase of the Logic process is caused but also that the Logic circuit characteristics and the reliability thereof are deteriorated. Therefore, in view of change and development in Logic FAB, analog circuits, particularly circuits whose characteristics are affected by 1/f noise, avoid the second chip (logic chip) 12 and are mounted on the first chip (CIS chip) 11.

1/f noise is not managed if a low-cost Logic is used, and conversely a process in which it is managed leads to high cost.

The support substrate 13 is a substrate used for a general CIS (not shown), and a silicon crystalline substrate or an SOI substrate is used.

In the present embodiment, a single layer or plural layers of the interconnect layer 15 are formed on a silicon or SOI substrate and are used as an interposer mainly for connection of signals and power supply between the first chip (CIS chip) 11 and the second chip (logic chip) 12.

Furthermore, it is also possible to include, besides the interconnect, passive elements such as a resistor and a capacitor and active elements such as a transistor.

<2. Process Flow>

FIGS. 2A to 2D are diagrams showing the process flow of a solid-state imaging device relating to the present embodiment.

The following is the outline of the process flow.

Figure 2A:
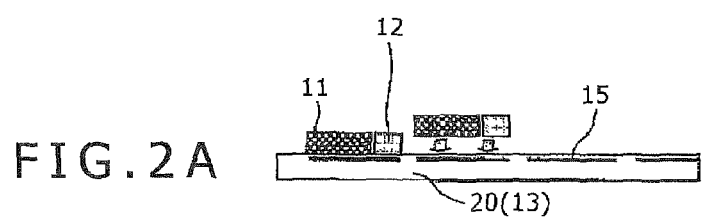
FIGS. 2A to 2D are diagrams showing the process flow of the solid-state imaging device with a stacking structure relating to the present embodiment.
Figure 2B:
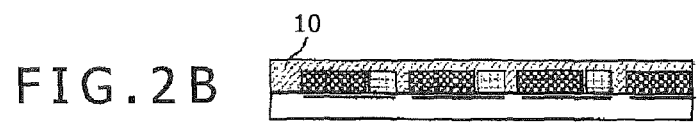

As shown in FIG. 2A, onto a support substrate wafer 20 on which the interconnects 15 by a single layer or plural layers of the interconnect layer are formed, the first chips (CIS chips) 11 and the second chips (logic chips) 12 cut out into individuals are bonded, with the circuit surfaces oriented toward the downward direction (face down).

The individual chips (CIS and Logic) 11 and 12 are bonded to the entire surface of the support substrate wafer 20 in a tile manner. Furthermore, thereafter, as shown in (B) of FIG. 2, a resin 16 is applied to fill the gaps between the chips.

Next, the back surface side of the individual chips is polished.

Figure 2C:
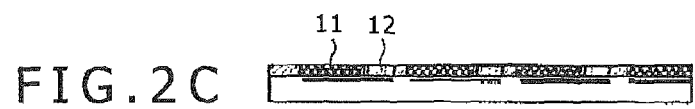

Subsequently, as shown in FIG. 2C, polishing is performed to the predetermined thinness necessary for the solid-state imaging device 10, to control the thickness of the individual first chips (CIS chips) 11.

At this time, simultaneously the second chips (logic chips) 12 are also polished.

At this timing, the respective individual chips 122 and 123 are mounted in a tile manner on the support substrate wafer 20 without concavity and convexity. In the subsequent process, processing similar to that for a normal wafer process is possible as a reconstructed wafer.

Figure 2D:
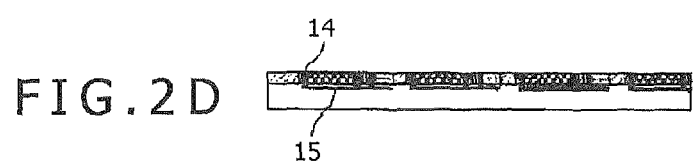

As shown in FIG. 2D, the through-VIAs 14 are formed by a wafer process from the back surface side of the individual chips 11 and 12, and the interconnect (signal, power supply) of the individual chip and the interconnect 15 on the support substrate are connected.

Although not shown in the diagram, the chips are cut out from the wafer after a color filter, an on-chip lens, etc. are formed, so that the solid-state imaging device 10 of FIG. 1 is completed.

<3. Circuit Configuration and Arrangement>

Next, a description will be made in association with FIG. 3 about the circuit arrangement relating to the present embodiment, i.e. the classification (dividing) of the circuits mounted on each of the first chip (CIS chip) 11 and the second chip (logic chip) 12.

Figure 3:
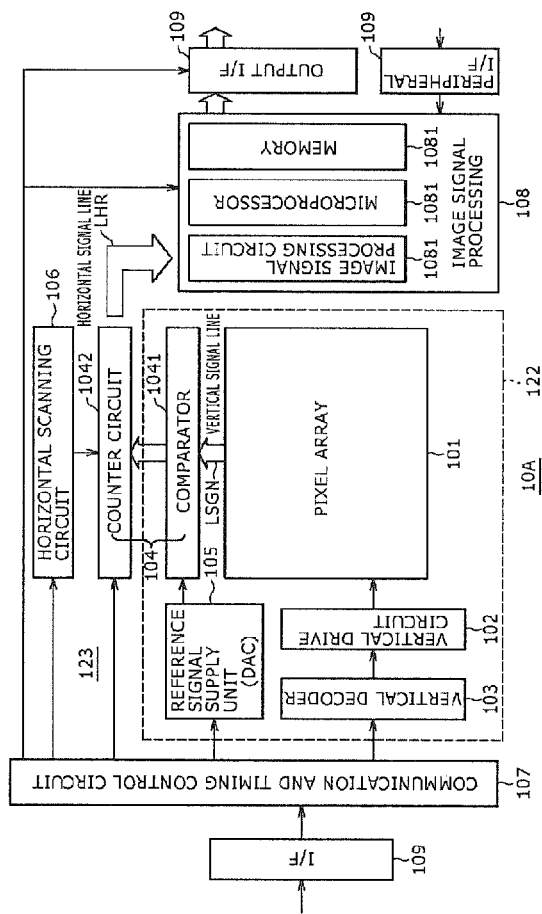
FIG. 3 is a block diagram showing a configuration example of the solid-state imaging device relating to the present embodiment.

FIG. 3 is a block diagram showing a configuration example of the solid-state imaging device relating to the present embodiment.

A solid-state imaging device 10A of FIG. 3 has the pixel array unit 101 in which a large number of unit pixels (not shown) including photoelectric conversion elements are two-dimensionally arranged in a matrix manner.

The solid-state imaging device 10A has the vertical drive circuit (row scanning circuit) 102, the vertical decoder 103, a column processor 104, and a reference signal supply unit 105, and is so configured as to include a horizontal scanning circuit (column scanning circuit) 106, a timing control circuit 107, and an image signal processor 108.

The solid-state imaging device 10A further has an I/F-system circuit 109.

The column processor 104 includes the comparator 1041 and a counter circuit 1042.

In this solid-state imaging device 10A, the timing control circuit 107 generates a clock signal, a control signal, and so forth serving as the basis of the operation of the vertical drive circuit 102, the column processor 104, the reference signal supply unit 105, the horizontal scanning circuit 106, and so forth based on the master clock.

Furthermore, the peripheral drive system that controls driving of the respective unit pixels of the pixel array unit 101 and the analog system, i.e. the vertical drive circuit 102, the comparator 1041 of the column processor 104, the reference signal supply unit 105, and so forth, are integrated on the same first chip 11 as that of the pixel array unit 101.

On the other hand, the timing control circuit 107, the image signal processor 108, the counter circuit 1042 of the column processor 104, and the horizontal scanning circuit 106 are integrated on the second chip (logic chip) 12 different from the above-described chip.

In FIG. 3, the part surrounded by the dashed line in the diagram is disposed on the first chip (CIS chip) 11 and the other part is disposed on the second chip (logic chip) 12.

The unit pixel has a photoelectric conversion element (e.g. photodiode) although diagrammatic representation is omitted here. The unit pixel has, in addition to the photoelectric conversion element, e.g. a transfer transistor that transfers a charge obtained by photoelectric conversion in the photoelectric conversion element to an FD (floating diffusion) part.

As the unit pixel, a pixel of a 3-transistor configuration having, in addition to the transfer transistor, a reset transistor that controls the potential of the FD part and an amplification transistor that outputs a signal dependent on the potential of the FD part can be employed. Alternatively, as the unit pixel, a pixel of a 4-transistor configuration additionally having a selection transistor for pixel selection or the like can be used.

In the pixel array unit 101, the unit pixels are two-dimensionally arranged for m columns and n rows. For this pixel arrangement of m rows and n columns, row control lines are wired on each row basis and column signal lines are wired on each column basis.

Each one end of the row control lines is connected to a respective one of the output terminals of the vertical drive circuit 102 for a corresponding one of the rows. The vertical drive circuit 102 is configured with shift registers and so forth and controls row addresses of the pixel array unit 101 and row scanning via the row control lines.

The column processor 104 has e.g. an ADC (Analog digital converter) provided for each of the pixel columns of the pixel array unit 101, i.e. for each of vertical signal lines LSGN, and converts an analog signal output from the respective unit pixels of the pixel array unit 101 on each column basis to a digital signal and outputs the digital signal.

The reference signal supply unit 105 has e.g. a DAC (digital-analog converter) as means to generate a reference voltage Vref with a so-called ramp (RAMP) waveform, whose level changes in a slope manner as time goes by.

The means to generate the reference voltage Vref with the ramp waveform is not limited to the DAC.

Under control by the control signal given from the timing control circuit 107, the DAC generates the reference voltage Vref with the ramp waveform and supplies it to the ADCs of the column processor 104 based on the clock given from the timing control circuit 107.

Each of the ADCs has such a configuration as to be capable of selectively carrying out AD conversion operation corresponding to the respective operating modes of a normal frame rate mode by the progressive scanning system of reading out information of all of the unit pixels and a high-speed frame rate mode.

The high-speed frame rate mode is an operating mode in which, compared with in the normal frame rate mode, the exposure time of the unit pixel is set to 1/N to raise the frame rate to N times, e.g. two times.

Switching of this operating mode is carried out through control by the control signal given from the timing control circuit 107. Furthermore, to the timing control circuit 107, directive information for switching of the respective operating modes of the normal frame rate mode and the high-speed frame rate mode is given from an external system controller (not shown).

The ADCs all have the same configuration and have the comparator 1041, e.g. an up/down counter that is the counter circuit 1042, a transfer switch, and a memory device.

The comparator 1041 compares the signal voltage of the vertical signal line dependent on the signal output from each unit pixel on the n-th column of the pixel area unit 101 with the reference voltage Vref with the ramp waveform supplied from the reference signal supply unit 105.

In the comparator 1041, for example, its output Vco becomes the "H" level when the reference voltage Vref is higher than the signal voltage, and the output Vco becomes the "L" level when the reference voltage Vref is equal to or lower than the signal voltage Vx.

The counter circuit 1042, which is an up/down counter, is an asynchronous counter. Under control by the control signal given from the timing control circuit 107, the clock is given thereto from the timing control circuit simultaneously and in parallel with the DAC.

The counter circuit 1042 performs down (DOWN) count or up (UP) count in synchronization with this clock to thereby measure the comparison period from the start of comparison operation in the comparator 1041 to the end of the comparison operation.

In this manner, the analog signal supplied on each column basis from each unit pixel of the pixel array unit 101 via the column signal line is converted to an N-bit digital signal and stored in the memory device by each operation of the comparator 1041 and the up/down counter circuit 1042.

The horizontal scanning circuit 106 is configured with shift registers and so forth and controls column addresses of the ADCs in the column processor 104 and column scanning.

Under control by this horizontal scanning circuit 106, the N-bit digital signals obtained by the AD conversion by each of the ADCs are sequentially read out to a horizontal signal line LHR and output to the image signal processor 108 as imaging data via this horizontal signal line LHR.

The image signal processor 108 is a circuit that executes various kinds of signal processing for the imaging data and is so configured as to include an image signal processing circuit ISP (Image Signal Processor) 1081, a microprocessor 1082, a memory circuit 1083, and so forth.

In the present embodiment, the signal voltage of the vertical signal line LSGN dependent on the signal output from each unit pixel is compared with the reference voltage Vref with the ramp waveform supplied from the reference signal supply unit 105 by the comparator 1041 mounted on the first chip (CIS chip) 11.

Furthermore, from the comparison result, the comparison period from the start of comparison operation to the end of the comparison operation is measured by the counter circuit 1042 mounted on the second chip (logic chip) 12.

Here, that the through-VIA and the interconnect 15 on the support substrate 13 are inserted between the comparator 1041 and the counter circuit 1042 each mounted on the upper and lower chips and the video signal path, by which signal transfer is carried out via this, is isolated at this part is one of the characteristics of the present embodiment.

The comparator 1041 mounted on the first chip (CIS chip) 11 is configured with only high-breakdown-voltage transistors (HV Tr.).

The comparator 1041 is mounted on the same chip (CIS chip) 11 as that of the pixel array unit 101 and the reference signal supply unit 105, and the process is so managed that sufficient characteristics are obtained as the analog characteristics and the noise characteristics (particularly 1/f noise).

The counter circuit 1042 mounted on the second chip (logic chip) 12 is configured with only low-breakdown-voltage transistors (LV Tr.), and high-speed operation design with use of an advanced Logic process is carried out.

The through-via is susceptible to crosstalk noise from an adjacent signal because of its structure. In the case of connecting a video signal of the ADC part whose interconnect pitch is particularly narrow, a CMOS digital signal that is as robust against noise as possible needs to be used.

The output of the comparator 1041 is such a CMOS logic signal having data on the so-called time axis that, for example, the output Vco becomes the "H" level when the reference voltage Vref is higher than the signal voltage and the output Vco becomes the "L" level when the reference voltage Vref is equal to or lower than the signal voltage Vx. The noise resistance of this CMOS logic signal is comparatively high.

<4. Pad Structure>

Figure 4:
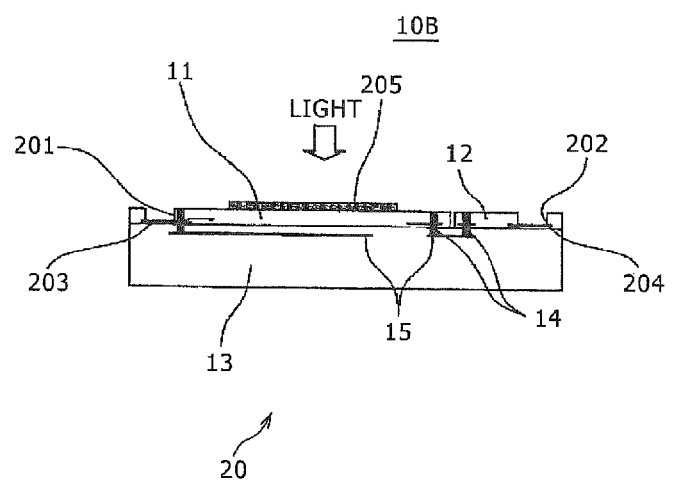
FIG. 4 is a diagram for explaining a first pad structure relating to the present embodiment.

FIG. 4 is a diagram for explaining a first pad structure relating to the present embodiment.

For pads, before processing of cutting out chips, aperture parts 201 and 202 are formed by a wafer process from the back surface side of each of the first chip (CIS chip) 11 and the second chip (logic chip) 12 on the wafer 20 of the support substrate 13.

Furthermore, the pads are formed from uppermost interconnect layers (Al) 203 and 204 formed from Al of the respective chips.

In addition, a color filter and an on-chip lens 205 are disposed on the light incident side of the first chip (CIS chip) 11.

Figure 5:
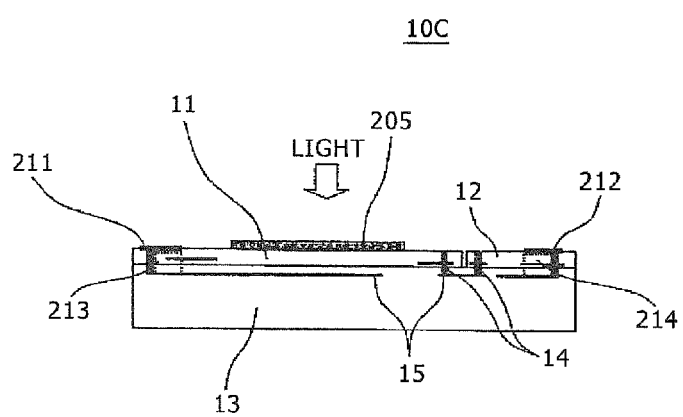
FIG. 5 is a diagram for explaining a second pad structure relating to the present embodiment.

FIG. 5 is a diagram for explaining a second pad structure relating to the present embodiment.

In the example of FIG. 5, metal interconnect processing is performed for the back surfaces of the respective individual chips 11 and 12 to form pads 211 and 212.

In this case, although the process steps increase compared with the example of FIG. 4, under-pad areas 213 and 214 of the individual chips 11 and 12 can be utilized as circuit arrangement and interconnect area.

As a result, when comparison is made with a chip of the same functions, the chip size can be reduced compared with the pad configuration of FIG. 4.

<5. Chip Scale Package (CSP)>

Next, a description will be made about the CSP.

Figure 6:
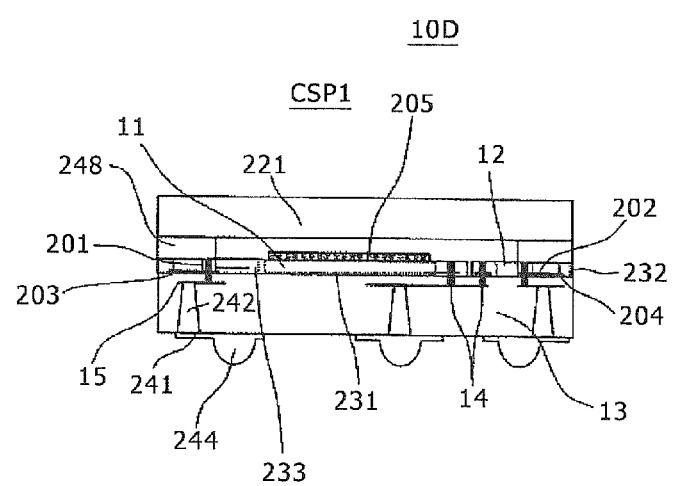
FIG. 6 is a diagram showing a first configuration example of a CSP (chip scale package)

FIG. 6 is a diagram showing a first configuration example of the CSP (chip scale package).

Figure 7:
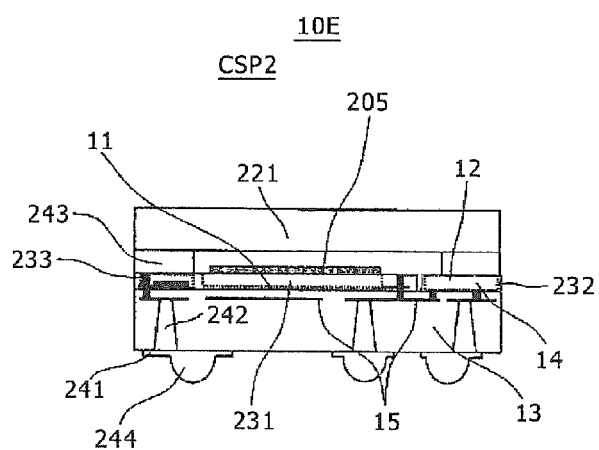
FIG. 7 is a diagram showing a second configuration example of the CSP (chip scale package)

FIG. 7 is a diagram showing a second configuration example of the CSP (chip scale package).

Figure 8:
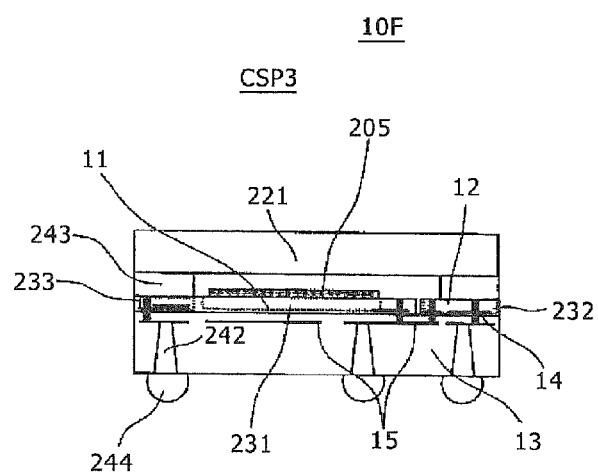
FIG. 8 is a diagram showing a third configuration example of the CSP (chip scale package)

FIG. 8 is a diagram showing a third configuration example of the CSP (chip scale package).

The PAD electrodes (terminals) 203 and 204 of the respective individuals and the metal interconnects 15 on the support substrate (interposer) 13 are connected via the through-VIAS 14.

The metal interconnects 15 on the support substrate (interposer) 13 and back-surface interconnects 241 of the CSP are connected by TSVs (Through Silicon Vias) 242.

As the pad structure, either of the configurations of FIG. 4 and FIG. 5 can be employed.

Furthermore, a cover glass 221 is bonded by an adhesive 243 to protect the color filter and the on-chip lens 205 on the CIS light receiving surface.

The cover glass 221 may be cut out by dicing after being bonded in a wafer state, or may be bonded on each chip basis after chip individuals are cut out.

In FIG. 6, 231 denotes the circuit area of the first chip (CIS chip) 11. 232 denotes the circuit area of the second chip (logic chip) 12. 233 denotes the peripheral circuit area of the first chip 11.

The pad aperture parts 201 and 202 are used in a probe test (before cover glass bonding). However, as shown in FIG. 7, the probe pad aperture parts 201 and 202 may be omitted based on the premise that the probe test is performed by using a metal ball 244 or an electrode of the RDL interconnect 241.

In this case, further reduction in the chip size is allowed.

A characteristic of the present embodiment is that the connection between the pad (PAD) electrodes (terminals) 203 and 204 and the back-surface interconnects 241 of the CSP goes through the interconnects 15 on the support substrate (interposer) 13.

This makes it possible that the TSV 242 is disposed at an arbitrary position independently of the floor plan of the respective individual chips as shown in FIG. 6 and FIG. 7.

This can reduce mismatch of the relationship between the ball arrangement of CSP1 and SCP2 and the circuit arrangement of the individual chips 11 and 12, and allows more flexible ball arrangement or floor plan of the individual chips.

Alternatively, it is also possible to omit the RDL interconnect 241 as shown in FIG. 8.

<6. Bonding of Individual Chips>

Figure 9:
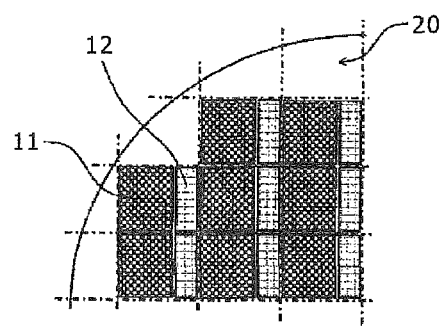
FIG. 9 is a diagram for explaining a first example of bonding of first chips (CIS chips) and second chips (logic chips) to a support substrate wafer.

FIG. 9 is a diagram for explaining a first example of bonding of the first chips (CIS chips) and the second chips (logic chips) to the support substrate wafer.

Figure 10:
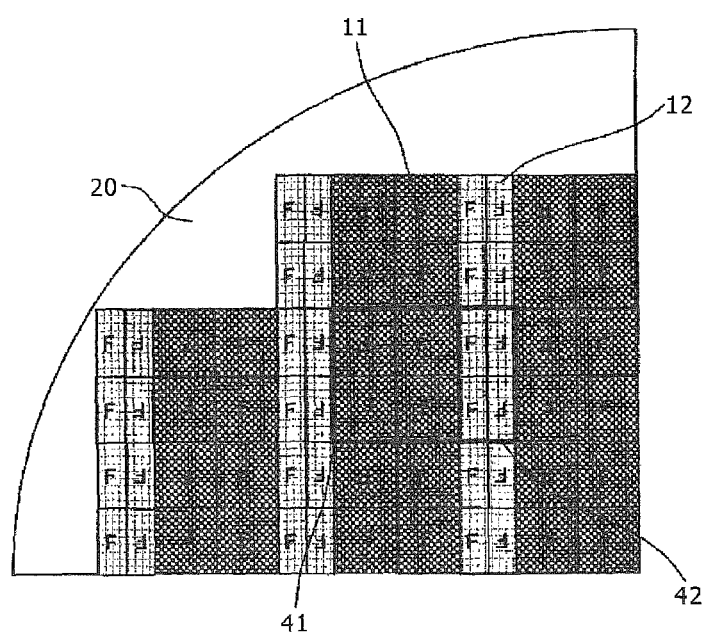
FIG. 10 is a diagram for explaining a second example of bonding of the first chips (CIS chips) and the second chips (logic chips) to the support substrate wafer.

FIG. 10 is a diagram for explaining a second example of bonding of the first chips (CIS chips) and the second chips (logic chips) to the support substrate wafer.

In the bonding of the individual chips to the support substrate wafer 20, as shown in FIG. 9, basically the CIS chips 11 and the logic chips 12 are alternately disposed and the chips are cut out as pairs of each one of these chips.

However, in the case in which the chip size is particularly small and so forth, the number of acquired chips per a wafer increases and the bonding based on each one chip leads to increase in the mounting cost.

Therefore, the mounting cost can be reduced by changing the chip arrangement and performing the bonding based on masses of plural chips (chip clusters) 41 and 42 as shown in FIG. 10 for example.

In this case, a chip selection test before the bonding is not performed.

The chip arrangement and the number of chips in the cluster are not limited to the example of FIG. 9.

As described above, the solid-state imaging device 10, which is one example of the semiconductor device of the present embodiment, has the following characteristics.

In the present embodiment, an interconnect layer is provided on the support substrate 13 used for a CIS to carry out electrical connection between the first chip (CIS chip) 11 and the second chip (logic chip) 12 bonded onto the support substrate 13.

The support substrate (interposer) 13 includes the interconnect layer of Al, Cu, etc. and carries out the electrical connection between the first chip (CIS chip) 11 and the second chip (logic chip) 12.

Electrical connection between the interconnect of the first chip (CIS chip) 11 and the interconnect of the support substrate 13 and connection between the interconnect of the second chip (logic chip) 12 and the interconnect of the support substrate 13 are each carried out by the through-VIA 14.

Because the through-VIA 14 is processed by a wafer process, sufficiently minute patterning is possible.

The hole diameter of the through-VIA 14 is affected by the chip thickness of the first chip (CIS chip) 11 and the second chip (logic chip) 12. Therefore, a smaller chip thickness of the CIS chip and the logic chip is more advantageous for the microfabrication of the through-VIA 14.

Furthermore, it is also possible to mount, besides the interconnect, passive elements such as a resistor and a capacitor and active elements such as a transistor on the support substrate 13.

The CIS can be manufactured at low cost e.g. by forming an interposer by utilizing the support substrate 13 used in the back-illuminated type.

As the support substrate 13, a material whose thermal expansion coefficient is identical to or equivalent to that of the first chip (CIS chip) 11 and the second chip (logic chip) 12, e.g. a silicon single-crystal substrate or the like, is used.

When a comparison is made with a CIS of the SOC (System On Chip) type having the same functions as those of the present embodiment, the circuit configuration (cut edge of the circuit) of two individual chips of the present embodiment is optimally divided.

Due to this, the transistors Tr. of the first chip (CIS chip) 11 of the present embodiment can be formed only of high-breakdown-voltage Tr. (CMOS).

Furthermore, the number of interconnect layers is set to the minimum number of interconnect layers necessary for the configuration of the pixel array and the peripheral circuit thereof, which allows reduction in the manufacturing cost.

Incidentally, in a general CIS process, high-speed Tr. of low breakdown voltage LV is also necessary in addition to high-breakdown-voltage Tr. for high-speed logic circuits such as the control circuit and the image processing circuit. Furthermore, for the high-speed logic circuits, a larger number of interconnect layers than the necessary minimum number of interconnect layers for the pixel array and the peripheral circuit are necessary.

In the present embodiment, for the logic chip, a general-purpose LOGIC process with which change and development in FAB are easy is used.

General Logic circuits (including a memory circuit and an interface circuit) are mounted on the second chip (logic chip) 12, and circuits for which the analog characteristics and the noise characteristics are important are not mounted on the logic chip but mounted on the first chip (CIS chip) 11.

By aggressively utilizing the evolution of the process generation and using the most-advanced process, characteristic enhancement such as power consumption reduction and speed enhancement can be achieved for the second chip (logic chip) 12. As a result, the process generation differs between the first chip (CIS chip) 11 and the second chip (logic chip) 12 in many cases. For example, the process generation for the first chip (CIS chip) 11 is approximately 250 nm to 65 nm, and the process generation for the second chip (logic chip) 12 is approximately 90 nm, 65 nm, 40 nm, 32 nm or less.

By carrying out electrical connection by the through-VIA and so forth by use of a wafer process after mounting individual chips on the support substrate (interposer) wafer 20 and constructing a reassembled wafer, the arrangement density of terminals can be enhanced compared with bump (Bump) connection and so forth.

In the present embodiment, using a wafer process that is not limited to the through-VIA for the electrical connection is a characteristic, and microfabrication can be inexpensively realized compared with an assembly process such as bump connection.

The present embodiment is effective particularly if the chip size is small and the number of acquired chips per a wafer is large.

Furthermore, enhancing the arrangement density allows division into the optimum circuits that should be mounted on each of the first chip (CIS chip) 11 and the second chip (logic chip) 12, and allows characteristic enhancement and manufacturing cost reduction of the solid-state imaging device.

By using the optimum process for each of the first chip (CIS chip) 11 and the second chip (logic chip) 12, the characteristics can be maximally utilized.

Through omission of a surplus process, e.g. a high-speed logic process in the first chip (CIS chip) 11 or a pixel process in the second chip (logic chip) 12, improvement in the transistor characteristics and enhancement in the pixel characteristics due to improvement in the thermal history in the steps can be achieved.

Furthermore, improvement in the yield due to a decrease in the defect occurrence probability is allowed.

Combining the first chip (CIS chip) of different size and characteristics and the second chip (logic chip) 12 of different functions is possible, and various commercial product developments are allowed.

In forming a bonding PAD, a metal electrode formed in each individual chip is used.

In bonding of individual chips, it is possible that plural chips (chip cluster) are cut out without cutting and are directly mounted, for mounting cost reduction.

In the present embodiment, in the case of processing into a chip scale package (CSP), the PAD electrodes (terminals) of the respective individuals and the metal interconnects on the support substrate (interposer) are connected via the through-VIAs. Furthermore, the metal interconnects on the support substrate (interposer) and the back-surface interconnects of the CSP are connected by TSVs (Through Silicon Vias).

The connection between the PAD electrode (terminal) and the back-surface interconnect of the CSP via the interconnect on the support substrate (interposer) allows the TSV to be disposed at an arbitrary position independently of the floor plan of the respective individual chips.

Furthermore, it is also possible to utilize the interconnect on the support substrate (interposer) as a substitute for part of the RDL interconnect on the CSP back surface. For example, connecting power supply terminals of the chips makes it easy to integrate the power supply terminals and allows reduction in the number of balls of the CSP.

Moreover, it is possible to omit the RDL interconnect and realize the CSP with only the interconnect on the support substrate (interposer).

Furthermore, in bonding of the individual chips to the support substrate wafer, basically the first chips (CIS chips) 11 and the second chips (logic chips) 12 are alternately disposed and the chips can be cut out as pairs of each one of these chips.

In the case in which the chip size is particularly small and so forth, the number of acquired chips per a wafer increases and the bonding based on each one chip leads to increase in the mounting cost.

Therefore, the mounting cost can be reduced e.g. by changing the arrangement of the chips and performing the bonding based on masses of plural chips (chip clusters).

Moreover, according to the present embodiment, the following effects can be obtained.

By employing the output signal of the comparator as the signal at the edge part where signal supply/reception of image data is carried out, the problem of noise at the VIA connecting part can be reduced and the most suitable circuit configuration for the circuit arrangement between the logic chips is allowed.

By paying attention to the analog characteristics and the noise characteristics (particularly 1/f noise) and disposing circuits whose characteristics are affected by noise on the first chip (CIS chip), the CIS chip can realize characteristics excellent in the noise resistance.

By paying attention to the analog characteristics and the noise characteristics (particularly 1/f noise) and disposing circuits whose characteristics are affected by noise on the CIS chip, a general-purpose ASIC (Logic) process can be used for the logical chip. In addition, regarding the logic chip, change of wafer FAB and development to another FAB are easily allowed.

Cost reduction is achieved by using the minimum interconnect layer for the CIS chip, and the accompanying problems such as IR-drop (Drop) in the CIS chip can be solved by reinforcement with the interconnect on the support substrate (interposer).

The optimum process is a circuit that is configured with only high-voltage transistors (HV. Tr) and includes the necessary minimum number of interconnect layers for the CIS chip, and is a general-purpose ASIC process for the logic chip.

Using the same CIS chip and changing the logic chip allow various product developments.

By forming an interposer by utilizing a support substrate used for a CIS, cost increase of integration into a composite chip is minimized. In addition, further cost reduction is allowed by process optimization for each individual chip.

By forming, in addition to the interconnect, passive parts such as a resistor and a capacitor and active parts such as a transistor on the support substrate (interposer), reduction in the number of parts and miniaturization in the system in which the present solid-state imaging device is mounted can be achieved.

In configuring the CSP, there is no limit to the position of the TSV, and mismatch of the relationship between the ball arrangement of the CSP and the circuit arrangement of the individual chips can be reduced. Furthermore, responding by flexible ball arrangement is allowed for the substrate of the system in which the present solid-state imaging device is mounted.

Although the configuration of a CMOS image sensor has been described as one example of the semiconductor device in the present embodiment, the above-described configuration can be applied to e.g. a CMOS image sensor of the back-illuminated type and the above-described respective effects can be exhibited. However, even the front-illuminated type can also sufficiently exhibit the above-described respective effects.

The solid-state imaging element having such effects can be employed as an imaging device of a digital camera and a video camcorder.

In the configuration of FIG. 3, the vertical decoder 103, which is a digital-system circuit, is disposed on the first chip 11. However, in the present disclosure, as shown in FIG. 11, it is also possible to mount this vertical decoder 103 on the side of a second chip 12B and configure analog-system circuits and digital-system circuits in such a manner that these circuits are divided into different chips.

Moreover, in the above-described embodiment, a description has been made as the solid-state imaging device having the comparator circuit 1041 and the counter circuit 1042 as the column processor 104, as a column-parallel ADC as one example. However, the present disclosure can also employ systems such as column CDS and column QV.

Figure 11:
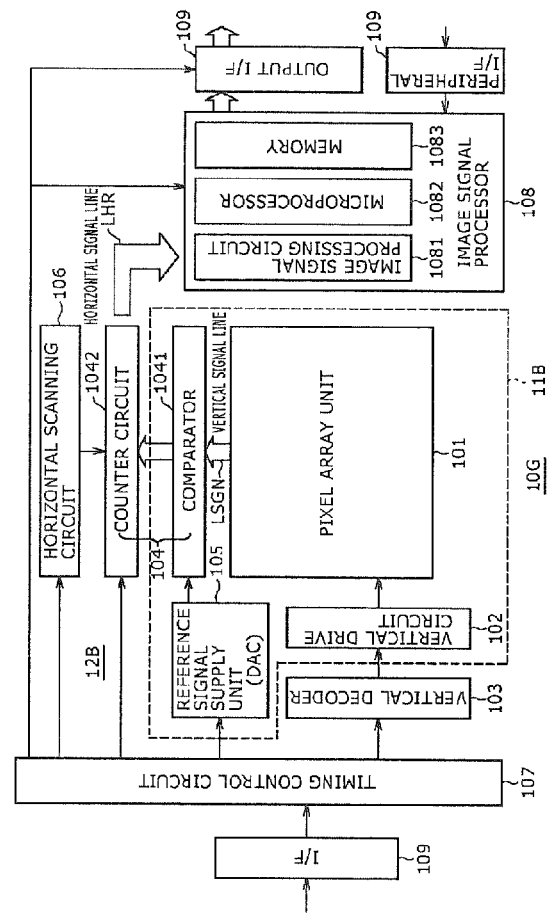
FIG. 11 is a block diagram showing another configuration example of the solid-state imaging device relating to the present embodiment.
Figure 12:
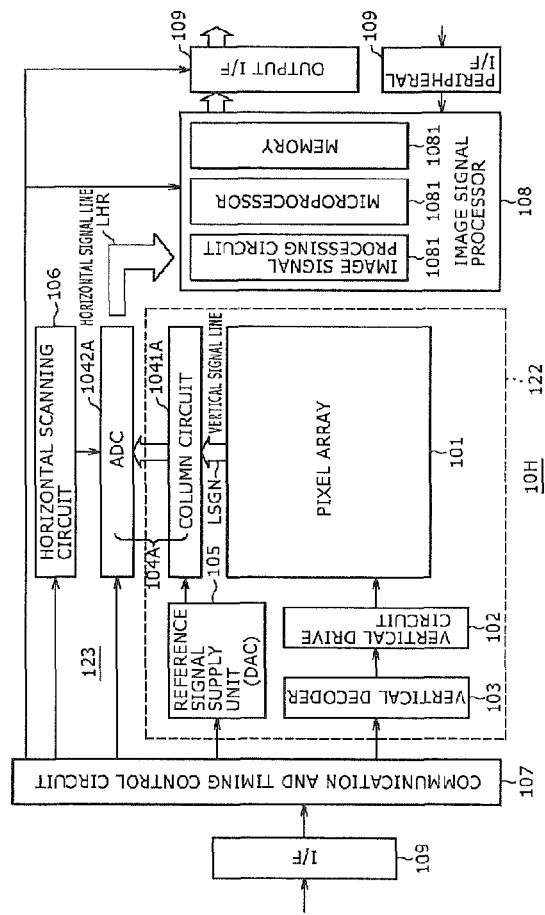
FIG. 12 is a block diagram showing further another configuration example of the solid-state imaging device relating to the present embodiment.
Figure 13:
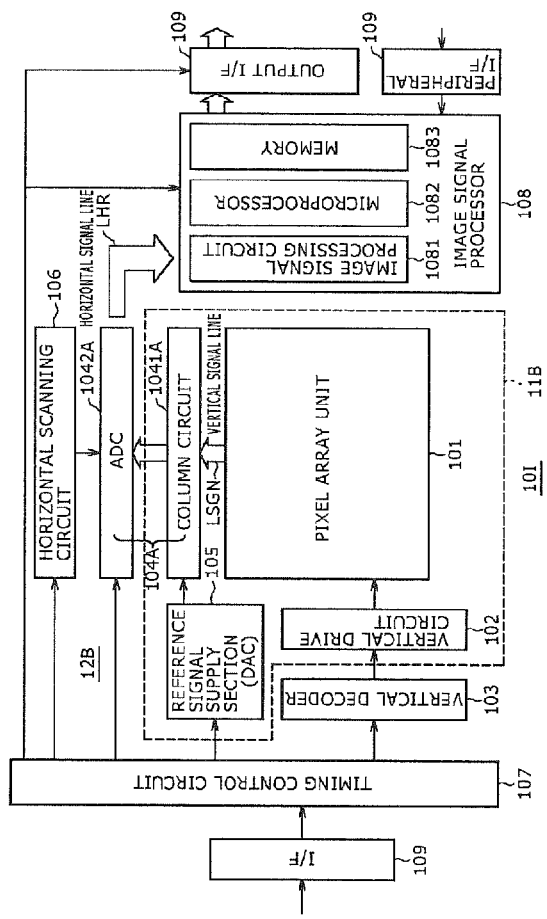
FIG. 13 is a block diagram showing further another configuration example of the solid-state imaging device relating to the present embodiment.

In this case, as shown in FIG. 12 and FIG. 13 corresponding to FIG. 3 and FIG. 11, it is also possible to configure the solid-state imaging device in such a manner that a column processor 104A has a column circuit 1041A and an ADC 1042A. In this example, the column circuit 1041A is disposed on the side of the first chip 11 and the ADC 1042A is disposed on the side of the second chip 12.

Figure 14:
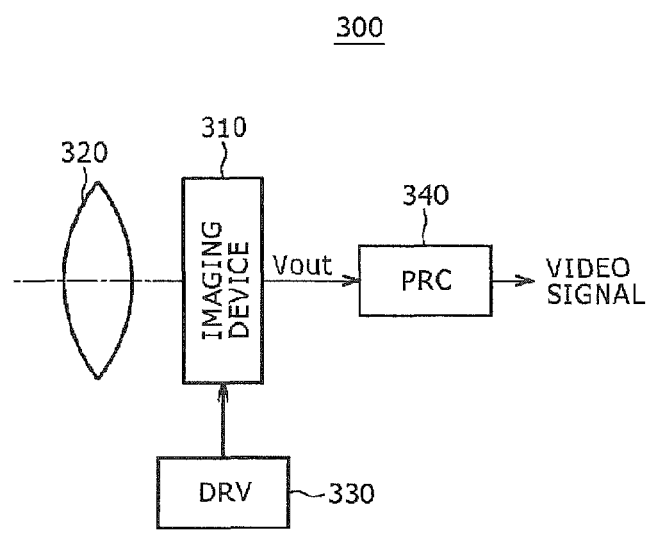
FIG. 14 is a diagram showing one example of the configuration of a camera system to which a solid-state imaging element relating to the embodiment of the present disclosure is applied.

FIG. 14 is a diagram showing one example of the configuration of a camera system to which the solid-state imaging device relating to the embodiment of the present disclosure is applied.

As shown in FIG. 14, the present camera system 300 has an imaging device 310 to which the CMOS image sensor (solid-state imaging device) 10, 10A, 10G, 10H or 10I relating to the present embodiment can be applied.

Furthermore, the camera system 300 has an optical system that guides incident light to the pixel area of this imaging device 310 (forms a subject image), e.g. a lens 320 that forms the image of the incident light (image light) on the imaging plane.

The camera system 300 has a drive circuit (DRV) 330 that drives the imaging device 310, and a signal processing circuit (PRC) 340 that processes the output signal of the imaging device 310.

The drive circuit 330 has a timing generator (not shown) that generates various kinds of timing signals including a start pulse and a clock pulse to drive the circuit in the imaging device 310, and drives the imaging device 310 by a predetermined timing signal.

Furthermore, the signal processing circuit 340 executes predetermined signal processing for the output signal of the imaging device 310.

The image signal processed by the signal processing circuit 340 is recorded in a recording medium such as a memory. The image information recorded in the recording medium is hard copied by a printer or the like. Furthermore, the image signal processed by the signal processing circuit 340 is displayed as a moving image on a monitor formed of a liquid crystal display or the like.

As described above, by mounting the above-described imaging element 10, 10A, 10G, 10H or 10I as the imaging device 310 in an imaging device such as a digital still camera, a high-definition camera can be realized.

The present disclosure contains subject matter related to that disclosed in Japanese Priority Patent Application JP 2010-127237 filed in the Japan Patent Office on Jun. 2, 2010, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

The invention claimed is:

1. A solid state imaging device, comprising:
    an imaging semiconductor chip on a front surface of a support substrate;
    an image processing semiconductor chip on the front surface of the support substrate,
        wherein the imaging semiconductor chip and the image processing semiconductor chip are in direct contact with the front surface of the support substrate;
    a comparator circuit on the imaging semiconductor chip;
    a counter circuit on the image processing semiconductor chip;
    an interconnect inserted between the comparator circuit and the counter circuit,
        wherein the interconnect is configured to electrically connect the image processing semiconductor chip to the imaging semiconductor chip, and
        wherein first portions of the interconnect extend to the front surface of the support substrate; and
    a plurality of pad electrodes connected to a plurality of back-surface interconnects through the interconnect.

2. The solid state imaging device according to claim 1, wherein the front surface of the support substrate is between the imaging semiconductor chip and a back surface of the support substrate.

3. The solid state imaging device according to claim 1, wherein the front surface of the support substrate is between the image processing semiconductor chip and a back surface of the support substrate.

4. The solid state imaging device according to claim 1, wherein at least one of the plurality of back-surface interconnects and the interconnect are connected by through-vias.

5. The solid state imaging device according to claim 1, wherein second portions of the interconnect extend from the support substrate to a back surface of the support substrate.

6. The solid state imaging device according to claim 1, wherein the first portions of the interconnect extend from the support substrate to the front surface of the support substrate.

7. The solid state imaging device according to claim 1, wherein a gap exists between the imaging semiconductor chip and the image processing semiconductor chip.

8. The solid state imaging device according to claim 7, wherein the gap includes a resin.

9. The solid state imaging device according to claim 1, wherein the support substrate is a silicon single-crystal substrate.

10. The solid state imaging device according to claim 1, wherein the support substrate is a silicon-on-insulator substrate.

11. The solid state imaging device according to claim 1, wherein the imaging semiconductor chip is a CMOS image sensor chip.

12. The solid state imaging device according to claim 1, further comprising:
    photoelectric conversion elements configured to convert light into analog signals,
    wherein the photoelectric conversion elements are in the imaging semiconductor chip.

13. The solid state imaging device according to claim 12, further comprising:
    a processing circuit configured to convert the analog signals into imaging data, wherein the processing circuit is in the image processing semiconductor chip.

14. The solid state imaging device according to claim 1, further comprising:
    a high-breakdown-voltage transistor in the comparator circuit on the imaging semiconductor chip; and
    a low-breakdown-voltage transistor in the counter circuit on the image processing semiconductor chip.

15. The solid state imaging device according to claim 14, wherein a first gate layer of the high-breakdown-voltage transistor is thicker than a second gate layer of the low-breakdown-voltage transistor.

16. The solid state imaging device according to claim 15, wherein the first gate layer of the high-breakdown-voltage transistor has a thickness ranging from 5 nm to 7 nm.

17. The solid state imaging device according to claim 15, wherein the second gate layer of the low-breakdown-voltage transistor has a thickness ranging from 1.5 nm to 3 nm.

18. The solid state imaging device according to claim 1, wherein the imaging semiconductor chip is between the support substrate and an on-chip lens.

19. An electronic device, comprising:
    a solid state imaging device comprising:
        an imaging semiconductor chip on a front surface of a support substrate;
        an image processing semiconductor chip on the front surface of the support substrate,
            wherein the imaging semiconductor chip and the image processing semiconductor chip are in direct contact with the front surface of the support substrate;
        a comparator circuit on the imaging semiconductor chip;

a counter circuit on the image processing semiconductor chip;
an interconnect inserted between the comparator circuit and the counter circuit,
wherein the interconnect is configured to electrically connect the image processing semiconductor chip to the imaging semiconductor chip, and
wherein portions of the interconnect extend to the front surface of the support substrate;
a plurality of pad electrodes connected to a plurality of back-surface interconnects through the interconnect; and
a lens configured to generate an image on an imaging plane of the solid state imaging device.

20. The electronic device according to claim 19, wherein the electronic device is a camera.

21. The solid state imaging device according to claim 1, wherein the interconnect comprises a plurality of interconnect layers in the support substrate.

22. The solid state imaging device according to claim 1, wherein the imaging semiconductor chip and the image processing semiconductor chip are in a positional relationship, and
wherein the imaging semiconductor chip is parallel to the image processing semiconductor chip on the support substrate.

* * * * *